United States Patent [19]
Liu et al.

[11] Patent Number: 6,060,954
[45] Date of Patent: May 9, 2000

[54] OSCILLATOR DEVICE HAVING INDUCTOR FORMED INSIDE MULTI-LAYER CIRCUIT BOARD

[75] Inventors: Chia-Wei Liu, Taoyuan Shien; Yu-Yuan Tsai, Taipei Shien, both of Taiwan

[73] Assignee: Delta Electronic, Inc., Taoyuan Shien, Taiwan

[21] Appl. No.: 09/089,269

[22] Filed: Jun. 2, 1998

[30] Foreign Application Priority Data

Nov. 28, 1997 [TW] Taiwan ................................ 86219945

[51] Int. Cl.$^7$ ................. H03B 5/18; H05K 1/16; H05K 1/18; H05K 7/02
[52] U.S. Cl. ..................... 331/99; 331/117 D; 361/761; 361/783; 361/795
[58] Field of Search .......................... 331/96, 99, 117 D; 361/748, 760, 761, 762, 763, 782, 783, 792, 795

[56] References Cited

U.S. PATENT DOCUMENTS

| | | | |
|---|---|---|---|
| 4,758,922 | 7/1988 | Ishigaki et al. | 331/96 |
| 5,227,739 | 7/1993 | Mandai et al. | 331/96 |
| 5,852,388 | 12/1998 | Nakai et al. | 331/96 |

*Primary Examiner*—Siegfried H. Grimm
*Attorney, Agent, or Firm*—Skjerven, Morrill, MacPherson, Franklin & Friel LLP

[57] ABSTRACT

An oscillator device including at least an inductor, a resistor, a transistor and a capacitor is disclosed. The oscillator device further includes a first transmission layer for electrically connecting the capacitor, the resistor and the transistor; a second transmission layer for forming the inductor; two ground layers electrically connected to the first and the second transmission layers and interconnected for providing a standard potential level; and three isolation layers located between the transmission layers and the ground layers for isolating the transmission layers from the ground layers.

14 Claims, 7 Drawing Sheets

OSCILLATOR DEVICE HAVING INDUCTOR FORMED INSIDE MULTI-LAYER CIRCUIT BOARD

FIELD OF THE INVENTION

The present invention is related to an oscillator device, and more particularly to an oscillator device having a reduced size and adapted to be used in a wireless communication equipment.

BACKGROUND OF THE INVENTION

In the electronic industry, it is a goal to make a product smaller, thinner, lighter and cheaper. For an oscillator device such as a voltage-control oscillator, an inductor included therein is one of the potential elements for being altered so as to reduce the overall size of the oscillator. In conventional oscillators, an SMD inductor having a small size is used. As known to those skilled in the art, unfortunately, SMD inductors are of very high cost. Alternatively, an inductor formed in a microstrip line manner is provided at a lower cost. The inductor, however, needs too large surface and occupies too much space.

SUMMARY OF THE INVENTION

An object of the present invention is to provide an oscillator device, which has an optimal equilibrium between cost and size.

The present invention is related to an oscillator device including at least an inductor, a resistor, a transistor and a capacitor. The present oscillator device further includes a first transmission layer for electrically connecting the capacitor, the resistor and the transistor; a second transmission layer for forming the inductor; a first ground layer electrically connected to the first and the second transmission layers for providing a standard potential level; a second ground layer electrically connected to the first and the second transmission layers and the first ground layer for providing the standard potential level; a first isolation layer located between the first transmission layer and the first ground layer for isolating the first transmission layer from the first ground layer; a second isolation layer located between the second transmission layer and the first ground layer for isolating the second transmission layer from the first ground layer; and a third isolation layer located between the second transmission layer and the second ground layer for isolating the second transmission layer from the second ground layer.

Preferably, each of the first, the second and the third isolation layers is made of an insulating material such as glassy fiber FR4.

In an embodiment, an electrical connection between the first ground layer and the first transmission layer, that between the first ground layer and the second transmission layer, that between the second ground layer and the first transmission layer, that between the second ground layer and the second transmission layer, and that between the second ground layer and the first ground layer are achieved by a via-hole technique which is well known to those skilled in the art and not to be redundantly described here.

Preferably, each of the first transmission layer, the second transmission layer, the first ground layer, and the second ground layer is made of a copper foil material.

According to a preferred embodiment, the first transmission layer is a microstrip line. Preferably, the second transmission layer is a strip line.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purposes of illustration and description only; it is not intended to be exhaustive or to be limited to the precise form disclosed.

Figure 1:
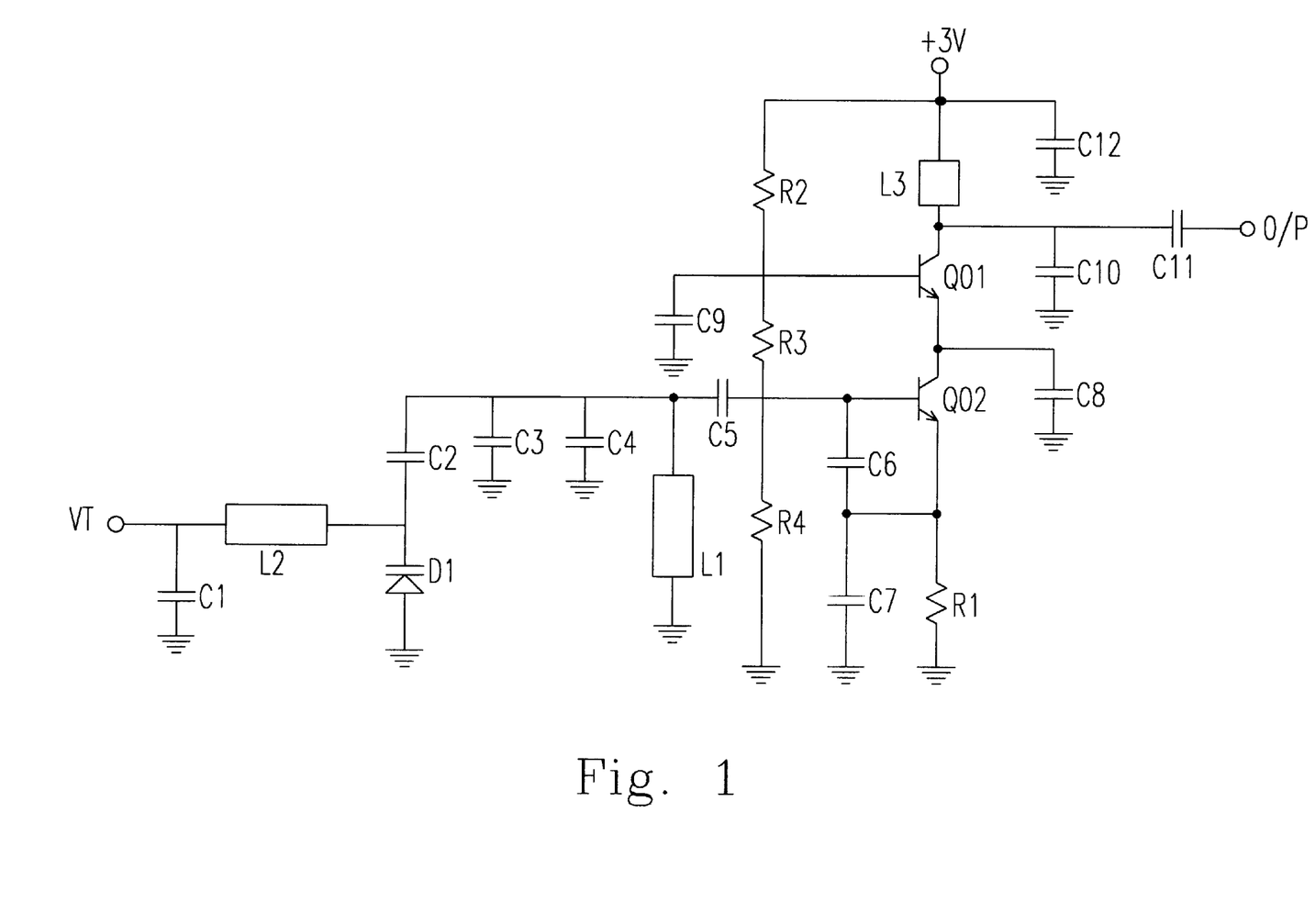
FIG. 1 is a schematic circuit diagram showing a preferred embodiment of an oscillator according to the present invention.

Please refer to FIG. 1 which is a schematic circuit diagram showing a preferred embodiment of an oscillator according to the present invention. As shown, the oscillator includes resistors, capacitors, transistors and inductors.

Figure 2A:
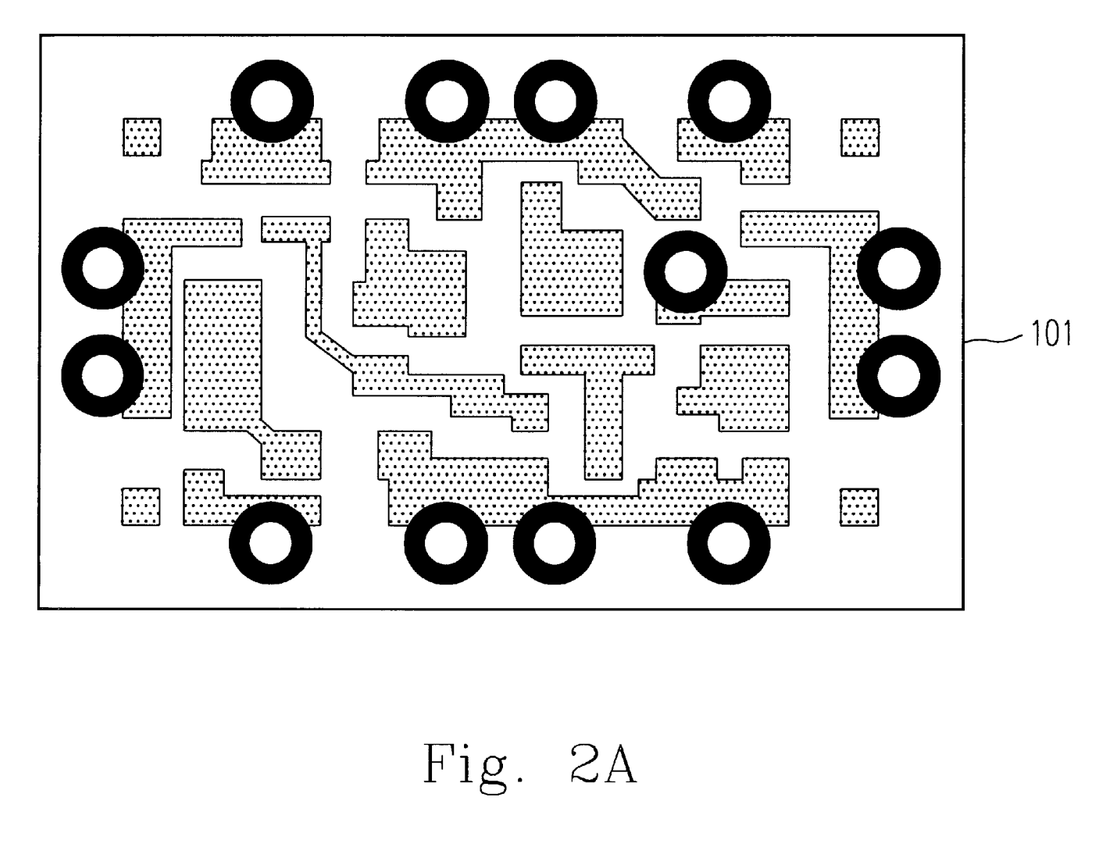
FIG. 2A is a schematic layout of the first transmission layer of an oscillator according to the present invention.

Please refer to FIG. 2A which is a schematic layout of the first transmission layer of the oscillator according to the circuit diagram of FIG. 1. In this case, the first transmission layer 101 is made of a copper foil material.

Figure 2B:
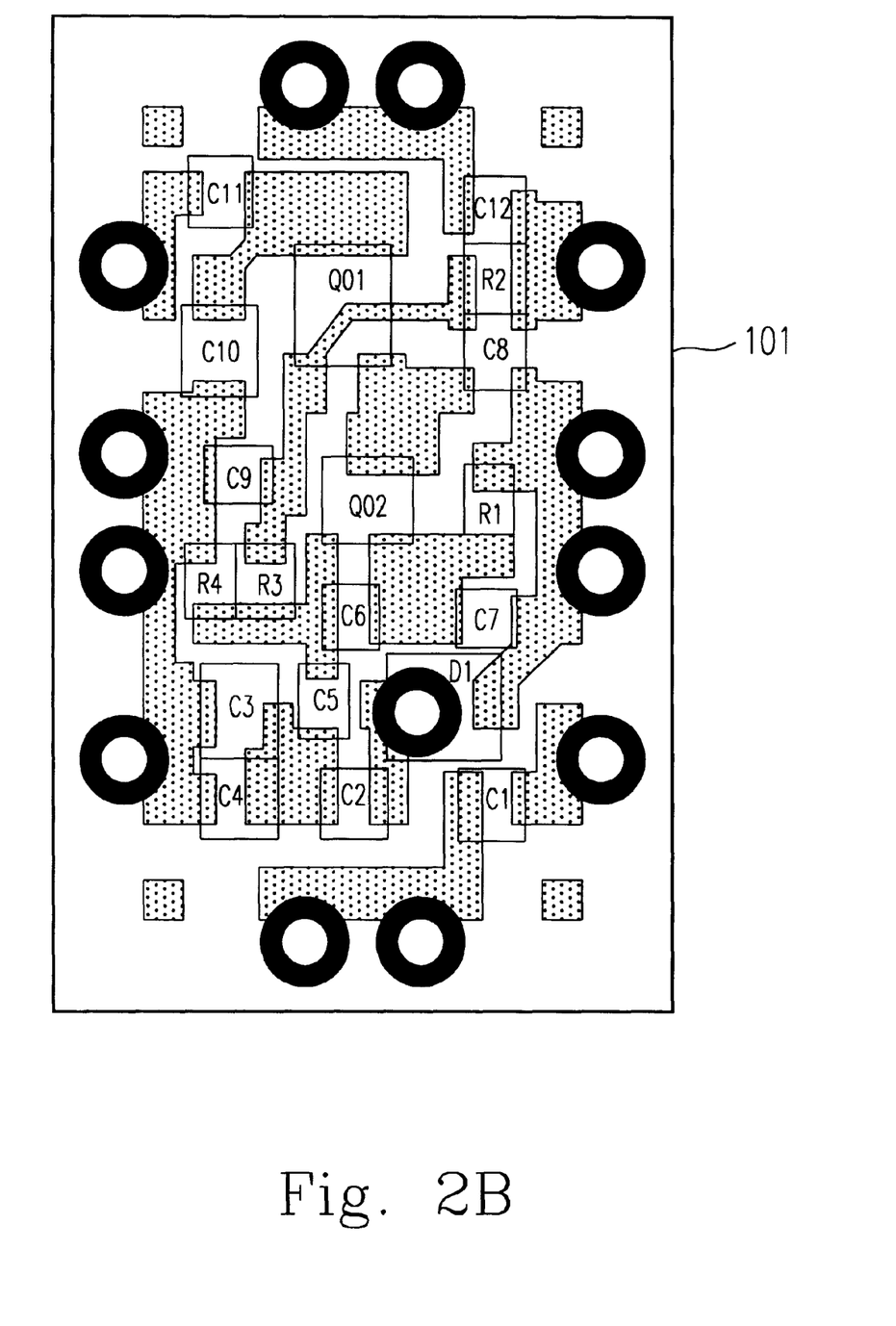
FIG. 2B is a cross-sectional view of an oscillator according to the present invention, schematically showing relative positions of various elements included therein.

Please refer to FIG. 2B which is a cross-sectional view of the oscillator according to the circuit diagram of FIG. 1, schematically showing relative positions of various elements above the first transmission layer 101.

Figure 2C:
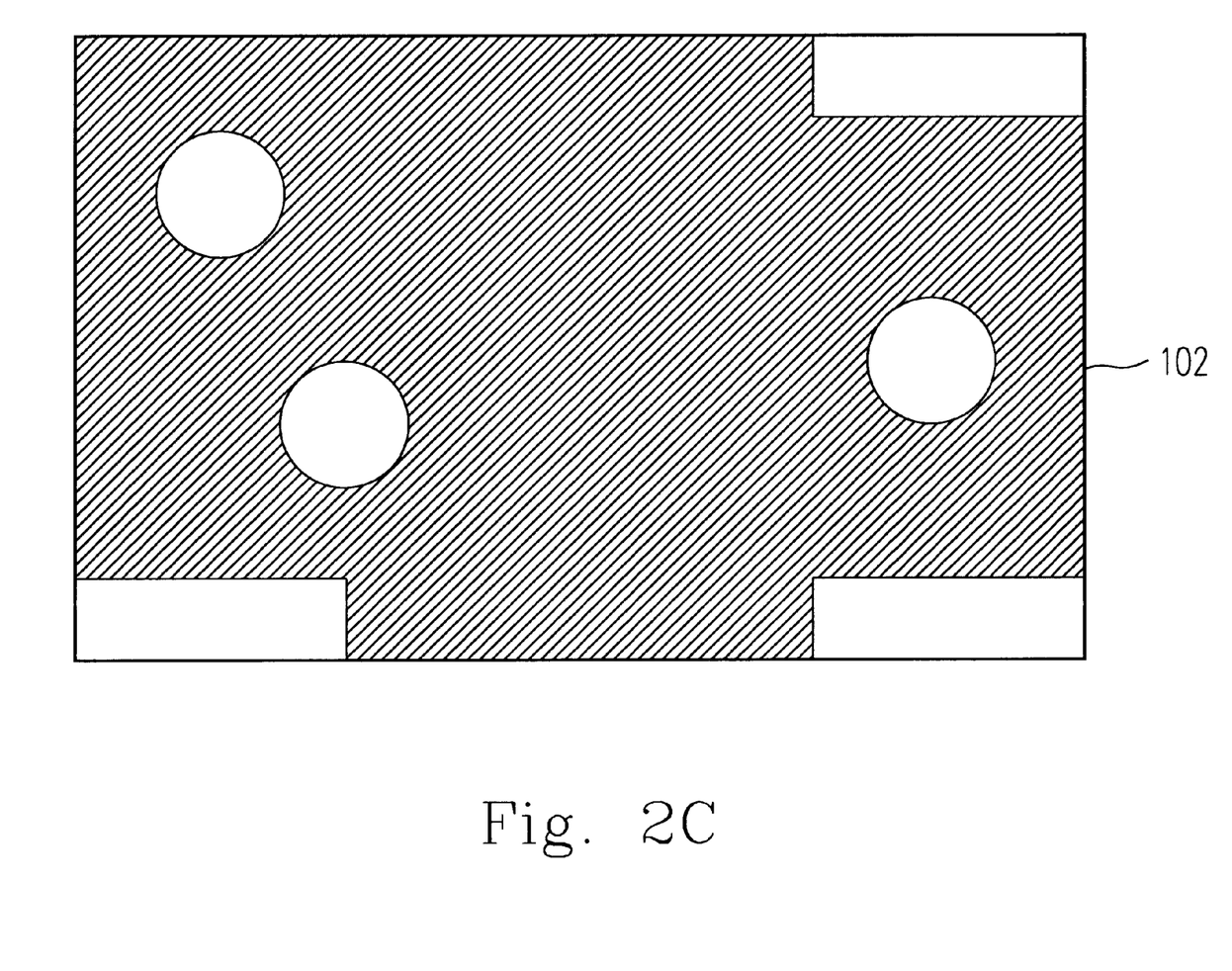
FIG. 2C is a schematic layout of the first ground layer of an oscillator according to the present invention.

Please refer to FIG. 2C which is a schematic layout of the first ground layer of the oscillator according to the circuit diagram of FIG. 1. In this case, the first ground layer 102 is made of a copper foil material.

Figure 2D:
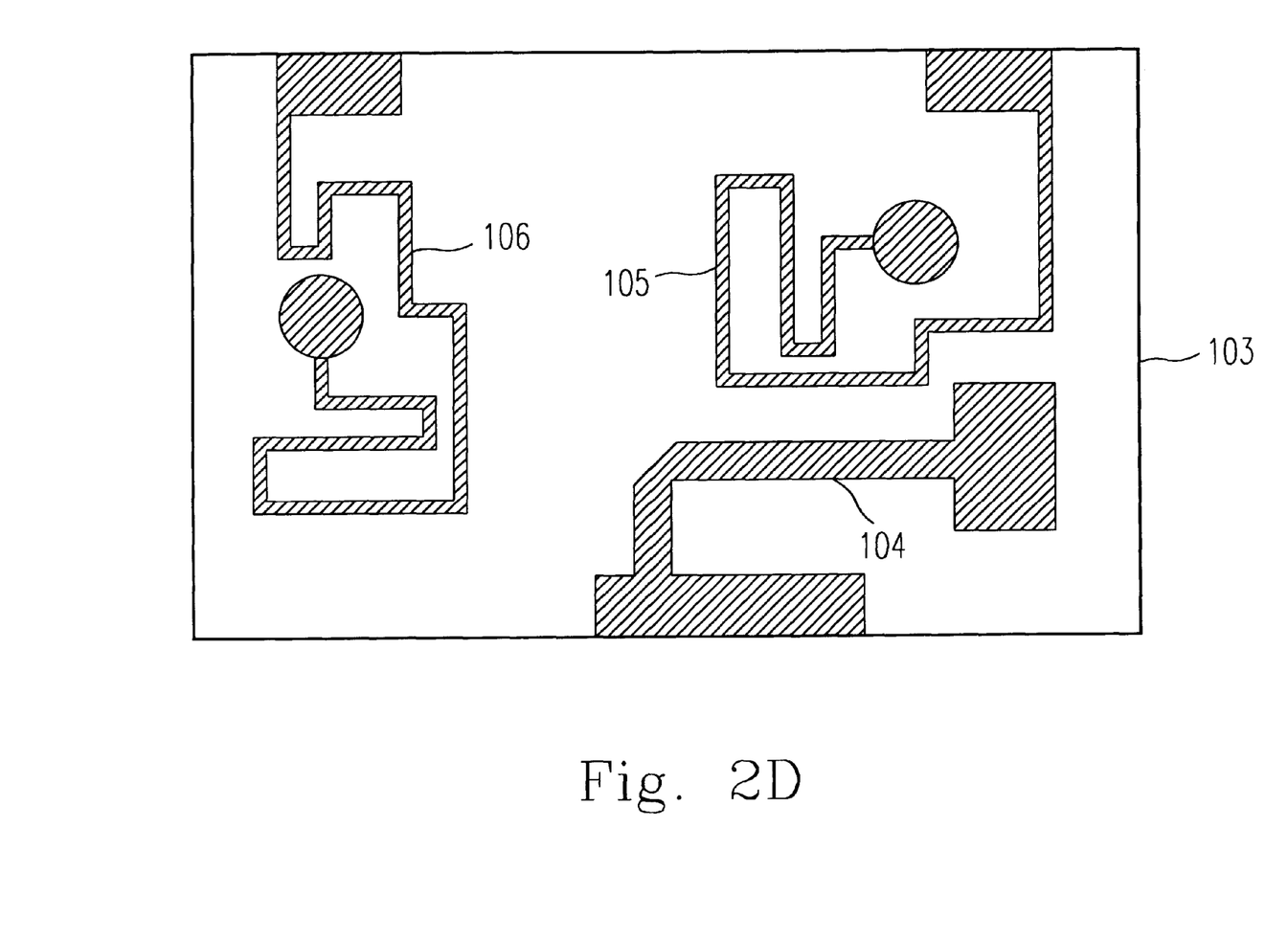
FIG. 2D is a schematic layout of the second transmission layer of an oscillator according to the present invention.

Please refer to FIG. 2D which is a schematic layout of the second transmission layer of the oscillator according to the circuit diagram of FIG. 1. In this case, the second transmission layer 103 is made of a copper foil material. Comparing the elements shown in FIG. 2D with those shown in FIG. 1, the element 104 indicates the inductor L1, the element 105 indicates the inductor L3, and the element 106 indicates the inductor L2.

Figure 2E:
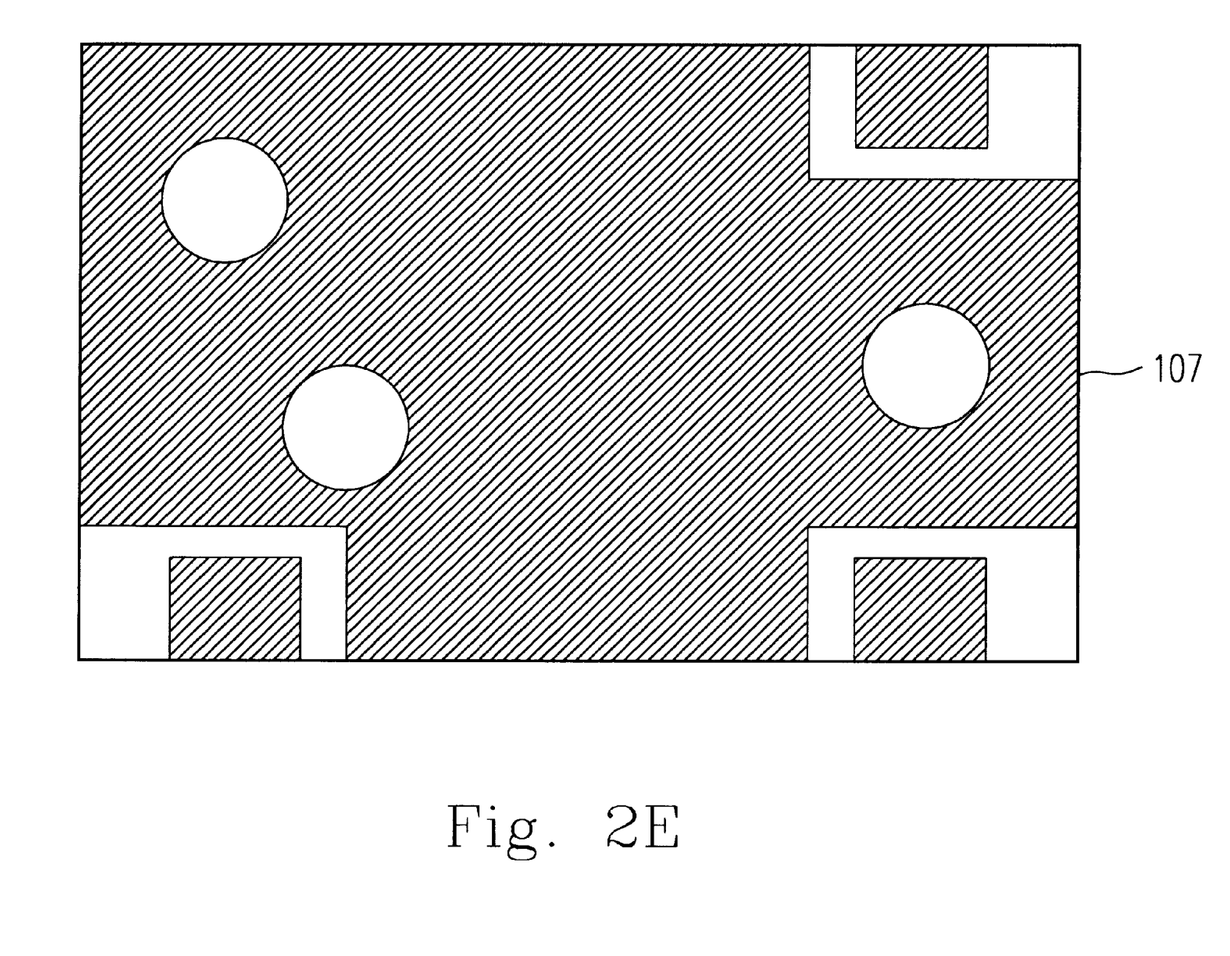
FIG. 2E is a schematic layout of the ground transmission layer of an oscillator according to the present invention.

Please refer to FIG. 2E which is a schematic layout of the second ground layer of the oscillator according to the circuit diagram of FIG. 1. In this case, the second ground layer 107 is made of a copper foil material.

Figure 2F:
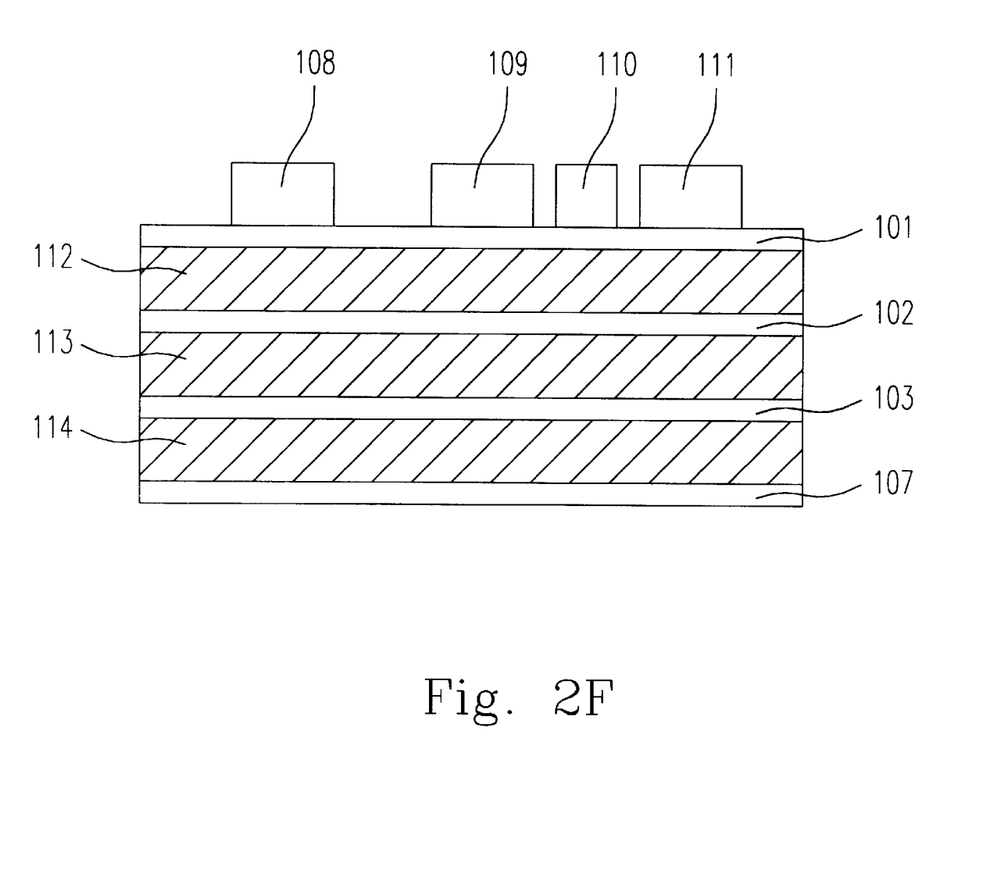
FIG. 2F is a profile view of the preferred embodiment of FIG. 1.

Please refer to FIG. 2F which is a profile view of the preferred embodiment of FIG. 1. A resistor 108, a transistor 109, a capacitor 110 and two diodes 111 are welded to the corresponding positions on the first transmission layer 101. The first transmission layer 101 is a microstrip line. On the other hand, the inductors L1, L2 and L3 of FIG. 1 are formed with the formation of the second transmission layer 103. The second transmission layer 103 is a strip line. In this case, the first and the second ground layers 102 and 107 provide a standard potential level, and are made to be electrically connected to the first and the second transmission layers 101 and 103 by a via-hole technique. Then, a first isolation layer 112 is used to isolate the first transmission layer 101 from the first ground layer 102, a second isolation layer 113 is used to isolate the second transmission layer 103 from the first ground layer 102, and a third isolation layer 114 is used to isolate the second transmission layer 103 from the second ground layer 107. Thereby, a structure of an oscillator according to the present invention is formed.

According to the above description, it is understood that the inductors of the oscillator according to the present invention are formed at the time the second transmission layer which is a strip line is formed. By utilizing a strip line and a microstrip line as the second transmission layer and the first transmission layer, respectively, and having the required elements electrically interconnected, an oscillator having a reduced surface is formed. Furthermore, the inductor formed through a strip line is lower in cost and more suitable for mass production than the SMD inductor is. The quality for each product can thus be uniform.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An oscillator device, comprising at least three inductors, a resistor, a transistor and a capacitor, said oscillator device further comprising:

a first transmission layer for electrically connecting said capacitor, said resistor and said transistor;

a second transmission layer having three inductors formed thereon as a strip-line structure;

a first ground layer electrically connected to said first and said second transmission layers for providing a standard potential level;

a second ground layer electrically connected to said first and said second transmission layers and said first ground layer for providing said standard potential level;

a first isolation layer located between said first transmission layer and said first ground layer for isolating said first transmission layer from said first ground layer;

a second isolation layer located between said second transmission layer and said first ground layer for isolating said second transmission layer from said first ground layer; and a third isolation layer located between said second transmission layer and said second ground layer for isolating said second transmission layer from said second ground layer.

2. The oscillator device according to claim 1 wherein each of said first, said second and said third isolation layers is made of an insulating material.

3. The oscillator device according to claim 2 wherein said insulating material is glassy fiber FR4.

4. The oscillator device according to claim 1 wherein an electrical connection between said first ground layer and said first transmission layer, that between said first ground layer and said second transmission layer, that between said second ground layer and said first transmission layer, that between said second ground layer and said second transmission layer, and that between said second ground layer and said first ground layer are achieved by a via-hole technique.

5. The oscillator device according to claim 1 wherein each of said first transmission layer, said second transmission layer, said first ground layer, and said second ground layer is made of a copper foil material.

6. The oscillator device according to claim 1 wherein said first transmission layer is a microstrip line.

7. An oscillator device, comprising:

a first transmission layer having capacitors, resistors and transistors formed thereon;

a second transmission layer having an inductive element and an RF-choking element formed thereon, said inductive element being grounded by one end thereof;

two ground layers electrically connected to both of said first and said second transmission layers for providing a standard potential level; and three isolation layers located between said first transmission layer and said first ground layer, said first ground layer and said second transmission layer, and said second transmission layer and said second ground layer, respectively, for isolating said first transmission layer, said first ground layer, said second transmission layer and said second ground layer from one another.

8. The oscillator device according to claim 7 wherein said inductive element is an inductor.

9. The oscillator device according to claim 8 wherein said RF-choking element includes two inductors.

10. The oscillator device according to claim 9 wherein said first transmission layer has a microstrip-line structure.

11. The oscillator device according to claim 10 wherein said second transmission layer has a strip-line structure.

12. An oscillator device formed of successively superimposed layers of a first transmission layer, a first isolation layer, a first ground layer, a second isolation layer, a second transmission layer, a third isolation layer and a second ground layer, wherein said first and said second ground layers are for providing a standard potential level for said first and said second transmission layers, and said first, said second and said third isolation layers are for isolating said first transmission layer, said first ground layer, said second transmission layer and said second ground layer from one another, said oscillator device comprising:

a circuit portion including capacitors, resistors and transistors and formed on said first transmission layer as a microstrip-line structure;

an inductive element having one end thereof grounded and formed on said second transmission layer as a strip-line structure; and an RF-choking element formed on said second transmission layer as a strip-line structure.

13. The oscillator device according to claim 12 wherein said inductive element is an inductor.

14. The oscillator device according to claim 13 wherein said RF-choking element includes two inductors.

* * * * *

EX PARTE REEXAMINATION CERTIFICATE (4919th)
United States Patent
Liu et al.

(10) Number: US 6,060,954 C1
(45) Certificate Issued: Mar. 16, 2004

(54) OSCILLATOR DEVICE HAVING INDUCTOR FORMED INSIDE MULTI-LAYER CIRCUIT BOARD

(75) Inventors: Chia-Wei Liu, Taoyuan Shien (TW); Yu-Yuan Tsai, Taipei Shien (TW)

(73) Assignee: Delta Electronics, Inc., Taoyuan Shien (TW)

Reexamination Request:
No. 90/006,073, Jul. 27, 2001

Reexamination Certificate for:
Patent No.: 6,060,954
Issued: May 9, 2000
Appl. No.: 09/089,269
Filed: Jun. 2, 1998

(30) Foreign Application Priority Data
Nov. 28, 1997 (TW) .......................................... 86219945

(51) Int. Cl.[7] ................................................ H03B 5/18
(52) U.S. Cl. ..................... 331/99; 331/117 D; 361/761; 361/783; 361/795
(58) Field of Search .............................. 331/99, 117 D; 361/761, 783, 795

(56) References Cited

U.S. PATENT DOCUMENTS 4,758,922 A * 7/1988 Ishigaki et al. ............. 361/330
5,172,077 A * 12/1992 Funada ........................ 331/67

OTHER PUBLICATIONS

Peter A. Rizzi, Microwave engineering passive circuits, 8 pages. 1988 by Prentice Hall.

* cited by examiner

*Primary Examiner*—Arnold Kinkead (57) ABSTRACT

An oscillator device including at least an inductor, a resistor, a transistor and a capacitor is disclosed. The oscillator device further includes a first transmission layer for electrically connecting the capacitor, the resistor and the transistor; a second transmission layer for forming the inductor; two ground layers electrically connected to the first and the second transmission layers and interconnected for providing a standard potential level; and three isolation layers located between the transmission layers and the ground layers for isolating the transmission layers from the ground layers.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 12–14 is confirmed.

Claims 6 and 10 are cancelled.

Claims 1, 7 and 11 are determined to be patentable as amended.

Claims 2–5, 8 and 9, dependent on an amended claim, are determined to be patentable.

New claims 15 and 16 are added and determined to be patentable.

1. An oscillator device, comprising at least three inductors, a resistor, a transistor and a capacitor, said oscillator device further comprising:
   a first transmission layer for electrically connecting said capacitor, said resistor and said transistor;
   a second transmission layer having three inductors formed thereon as a strip-line structure, *wherein said three inductors form at least an inductive element and an RF-choking element, said inductive element being grounded by one end thereof*;
   a first ground layer electrically connected to said first and said second transmission layers for providing a standard potential level;
   a second ground layer electrically connected to said first and said second transmission layers and said first ground layer for providing said standard potential level;
   a first isolation layer located between said first transmission layer and said first ground layer for isolating said first transmission layer from said first ground layer;
   a second isolation layer located between said second transmission layer and said first ground layer for isolating said second transmission layer from said first ground layer; and
   a third isolation layer located between said second transmission layer and said second ground layer for isolating said second transmission layer from said second ground layer.

7. An oscillator device, comprising:
   a first transmission layer having capacitors, resistors and transistors formed thereon;
   a second transmission layer having an inductive element and an RF-choking element formed thereon, said inductive element being grounded by one end thereof;
   two ground layers electrically connected to both of said first and said second transmission layers for providing a standard potential level; and
   three isolation layers located between said first transmission layer and [said] *a* first ground layer, said first ground layer and said second transmission layer, and said second transmission layer and [said] *a* second ground layer, respectively, for isolating said first transmission layer, said first ground layer, said second transmission layer and said second ground layer from one another.

11. The oscillator device according to claim [10] *16* wherein said second transmission layer has a strip-line structure.

*15. The oscillator device according to claim 1 wherein said first transmission layer is a microstrip line.*

*16. The oscillator device according to claim 9 wherein said first transmission layer has a microstrip-line structure.*

* * * * *